United States Patent
Tsai et al.

(10) Patent No.: US 9,514,266 B2
(45) Date of Patent: Dec. 6, 2016

(54) METHOD AND SYSTEM OF DETERMINING COLORABILITY OF A LAYOUT

(71) Applicant: TAIWAN SEMICONDUCTOR MANUFACTURING COMPANY, LTD., Hsinchu (TW)

(72) Inventors: Nien-Yu Tsai, Taichung (TW);
Chin-Chang Hsu, Banqiao (TW);
Wen-Chun Huang, Hsinchu (TW);
Wen-Ju Yang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 23 days.

(21) Appl. No.: 14/471,859

(22) Filed: Aug. 28, 2014

(65) Prior Publication Data
US 2016/0063169 A1    Mar. 3, 2016

(51) Int. Cl.
G06F 17/50    (2006.01)
G03F 7/00    (2006.01)

(52) U.S. Cl.
CPC .......... *G06F 17/5081* (2013.01); *G03F 7/0035* (2013.01)

(58) Field of Classification Search
CPC .................................................. G06F 17/5068
USPC ................................................................ 716/119
See application file for complete search history.

(56) References Cited

U.S. PATENT DOCUMENTS

2014/0237436 A1* 8/2014 Li ........................ G06F 17/50
716/55

* cited by examiner

*Primary Examiner* — Suresh Memula
(74) *Attorney, Agent, or Firm* — Hauptman Ham, LLP (57) ABSTRACT

A method of determining colorability of a layout includes generating a conflict diagram based on circuit information. The conflict diagram includes a plurality of nodes, each node of the plurality of nodes is connected to at least another node of the plurality of nodes by a link, and each node of the plurality of nodes has a degree equal to a number of links connected to the node. The method includes setting a degree of each anchor node within the conflict diagram to a value of n, where n is equal to a number of mask usable to manufacture the layout. The method further includes excluding, using a processor, nodes having a degree less than n from the conflict diagram. The method further includes performing a color status check on the conflict diagram after the excluding; and determining whether the layout is colorable based on the performed color status check.

20 Claims, 8 Drawing Sheets

METHOD AND SYSTEM OF DETERMINING COLORABILITY OF A LAYOUT

BACKGROUND

As technology nodes of semiconductor manufacturing decrease, multiple patterning techniques (MPT) are used to form features on a semiconductor wafer in closer proximity than is possible with a single patterning process. MPT use multiple masks in order to form the features on the semiconductor wafer. Coloring refers to the assignment of a particular feature to a corresponding mask.

A conflict graph is used to assist in the coloring process. The conflict graph includes nodes, each node corresponding to one of the features, and links connecting nodes. Links connect nodes which have a separation less than a minimum distance for forming nodes on a same mask. Nodes connected by a link are assigned to different masks, i.e., have different colors. Many conflict graphs include multiple coloring solutions. The multiple coloring solutions are called a solution space.

Rule-based approaches identify a single solution within the solution space. Rule-based approaches assign colors to different nodes based on defined rules. Once a rule-based approach identifies a solution which satisfies each of the rules, the rule-based approach stops. Heuristic approaches are able to identify multiple solutions within the solution space. However, the heuristic approach requires more processing time than the rule-based approaches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
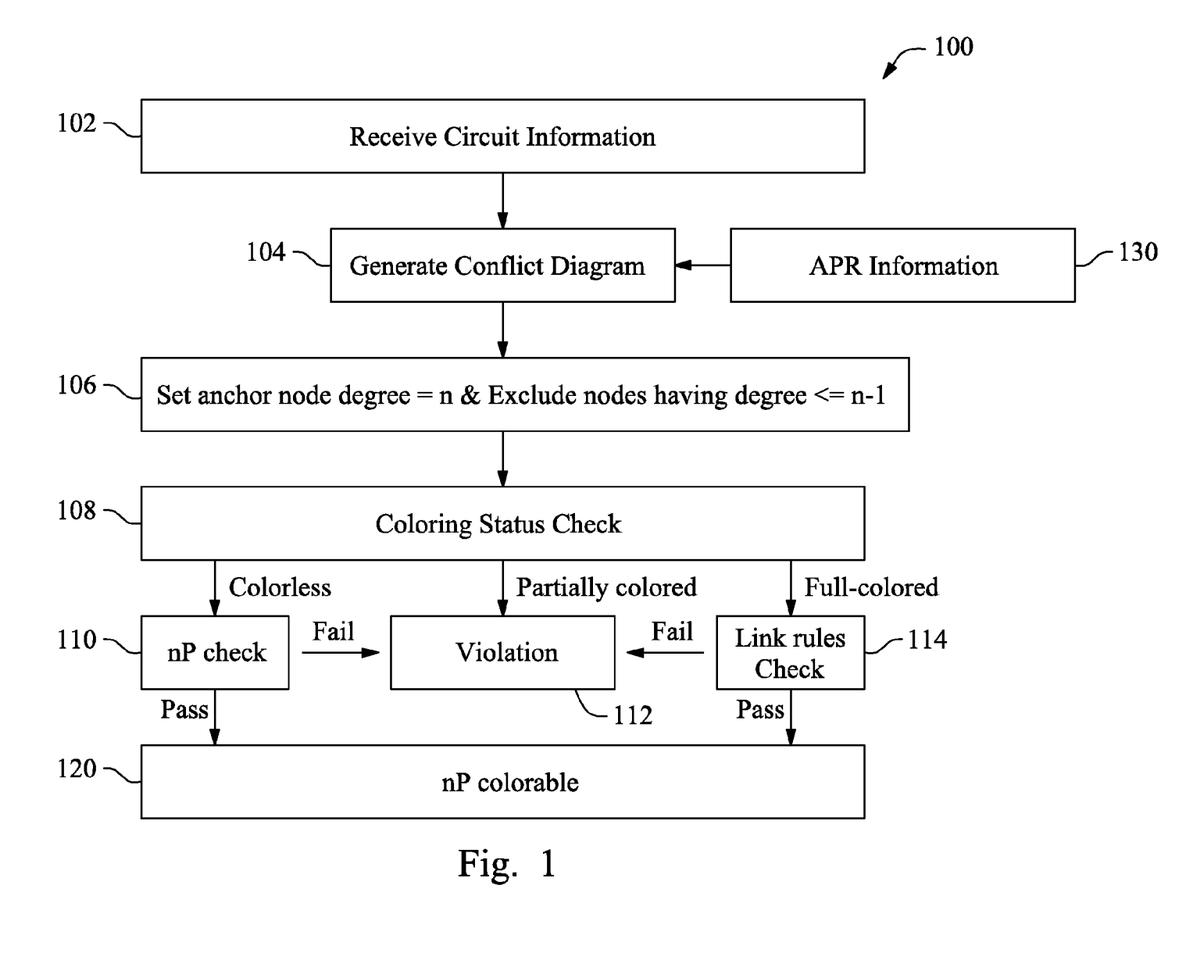
FIG. 1 is a flowchart of a method of determining colorability of a layout in accordance with some embodiments.

FIG. 1 is a flowchart of a method 100 of determining colorability of a layout in accordance with some embodiments. Method 100 begins with operation 102 in which circuit information is received. The circuit information includes a plurality of features and information related to the placement of the features in the layout. In some embodiments, the features include metal line patterns, implantation patterns, deposition pattern, or other suitable features of a semiconductor wafer. In some embodiments, at least one feature includes a polygonal shape. In some embodiments, at least one feature includes an irregular or freeform shape. In some embodiments, the circuit information includes information related to separation distances between individual features of the plurality of features. In some embodiments, the circuit information includes a schematic diagram, a graphic database system (GDS) file, a netlist file or another suitable circuit information format. In some embodiments, the circuit information is received from a circuit designer. In some embodiments, the circuit information is received from a customer. In some embodiments, the circuit information is received from a previously stored file. In some embodiments, the circuit information is received through an input/output apparatus. In some embodiments, the circuit information is received from a component within a system. In some embodiments, the circuit information is received in a first format and is converted to a second format different from the first format in operation 102.

Method 100 continues with operation 104 in which a conflict diagram is generated based on the circuit information. The conflict diagram includes a plurality of nodes. Each node corresponds to a feature of the circuit information. In some embodiments, each feature of the circuit information includes a single node. In some embodiments, more than one node is used to define a same feature. The conflict diagram also includes links connecting nodes which are associated with features having a separation below a resolution level of a single patterning process. The resolution level of a single patterning process defines a minimum separation distance between adjacent features which permits formation of the adjacent features accounting for variation during manufacturing of the features. Features which are separated by a distance below the minimum separation distance are represented in the conflict diagram by nodes connected by a link. In some embodiments, multiple links are connected to a single node. In some embodiments, the conflict diagram includes at least one anchor node. An anchor node is a node which has a pre-defined color. In some embodiments, the pre-defined color is selected by the circuit designer. In some embodiments, the pre-defined color is selected by the customer. In some embodiments, the pre-defined color is defined based on coloring of a connecting conflict diagram. In some embodiments, the pre-defined color is defined based on a standard cell, e.g., a standard cell of an automatic placement and routing (APR) block. In some embodiments, the conflict diagram is generated using a same computer as the circuit information. In some embodiments, the conflict diagram is generated using a different computer from that used to generate the circuit information.

In operation 106, each anchor node is set to a degree equal to n and each node having a degree less than n is excluded. A degree is a number of links connected to each node, and n is an integer equal to a number of masks used to manufacture the circuit. In some embodiments, n is equal to 3. In some embodiments, n is an integer value greater than 3. As an example, if the number of masks is equal to 3, i.e., triple pattern (TP), then each anchor node is assigned a value of 3 and each node having a degree of two or less (less than 3) is excluded. A node having a degree less than n is called a removable node. Operation 106 is performed in an iterative manner. In a TP example, a first node having a degree of 3 linked to a second node having a degree of 2. In a first iteration of operation 106, the second node would be excluded and the degree of the first node would be reduced to 2. In a second iteration of operation 106, the first node is also excluded. Operation 106 is repeated until no nodes are excluded. In operation 106, the anchor node is excluded if the conflict diagram has a single anchor node.

FIGS. 2A-2D are views of transitions of conflict diagrams following exclusion of removable links in accordance with some embodiments. FIGS. 2A-2D are examples of TP. Therefore, anchor nodes are set to a degree of 3 and nodes having a degree of 2 or less are excluded.

Figure 2A:
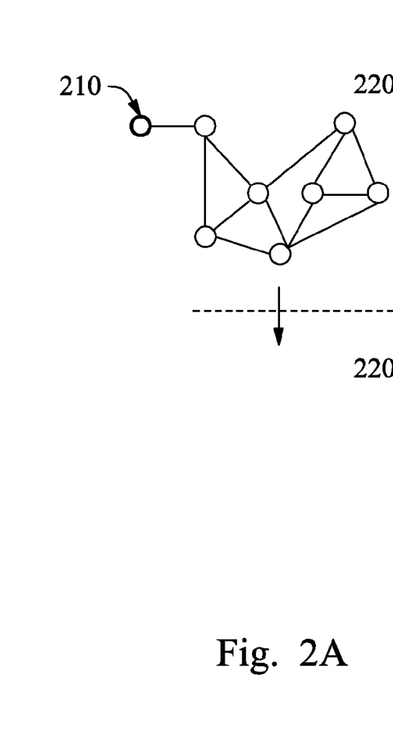
FIGS. 2A-2D are views of transitions of conflict diagrams following exclusion of removable links in accordance with some embodiments.

FIG. 2A is a view of a conflict diagram including one anchor node 210. Because the conflict diagram of FIG. 2A includes a single anchor node 210, the anchor node is excluded. Using the iterative process of operation 106, all nodes in the conflict diagram of FIG. 2A are eventually excluded.

Figure 2B:
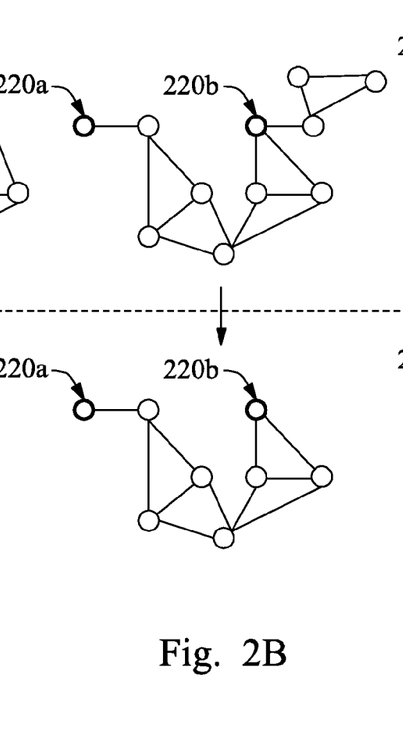

FIG. 2B is a view of a conflict diagram which includes an anchor node 220a and an anchor node 220b. Anchor node 220a and anchor node 220b have a same color. In some embodiments, anchor nodes have different colors. Using the iterative process of operation 106, several nodes are excluded. However, several nodes, other than anchor nodes 220a and 220b, remain following the iterative process of operation 106.

Figure 2C:
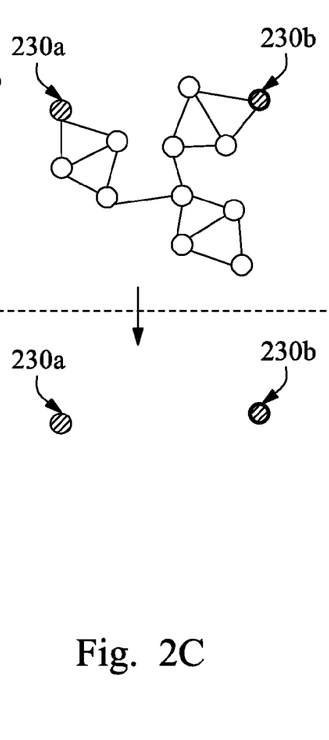

FIG. 2C is a view of a conflict diagram which includes an anchor node 230a and an anchor node 230b. Anchor node 230a has a different color from anchor node 230b. In some embodiments, anchor nodes 230a and 230b have a same color. Using the iterative process of operation 106, all nodes except for anchor nodes 230a and 230b are excluded.

Figure 2D:
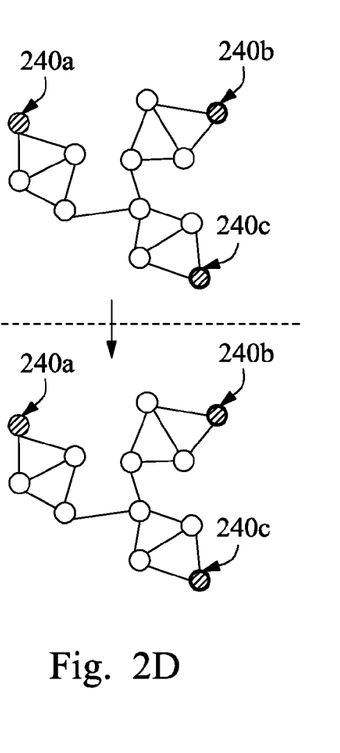

FIG. 2D is a view of a conflict diagram which includes an anchor node 240a, an anchor node 240b and an anchor node 240c. The conflict diagram of FIG. 2D is the same as the conflict diagram of FIG. 2C with the exception of the inclusion of a third anchor node, i.e., anchor node 240c. Since each of the anchor nodes 240a, 240b, and 240c are is set to a degree of 3, every node in the conflict diagram has a degree of 3. As a result none of the nodes are excluded by the process of operation 106.

Returning to FIG. 1, method 100 continues with operation 108 in which a coloring status of the conflict diagram is checked. The coloring status check is performed on the modified conflict diagram after exclusion of removable nodes. The coloring status falls into one of three categories, colorless, partially colored, and fully colored. A colorless status means that none of the nodes remaining following operation 106 have a pre-defined color, i.e., no anchor nodes are present. A conflict diagram in which all nodes are excluded, as in FIG. 2A, is also considered to have a colorless status. A partially colored status means that at least one node which has a pre-defined color, as well as at least one node which does not have a pre-defined color remains in the conflict diagram following operation 106. A fully colored status means that only nodes which have a pre-defined color remain in the conflict diagram following operation 106. In some embodiments, the coloring status check is performed by a same computer used to perform as at least one of operation 104 or operation 106. In some embodiments, the coloring status check is performed by a different computer from that used to perform at least one of operation 104 or operation 106.

Figure 3A:
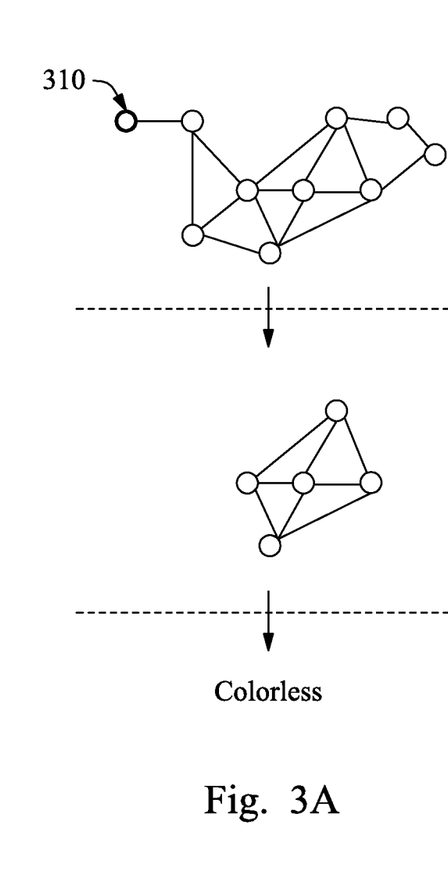
FIGS. 3A-3C are views of transitions of conflict diagrams through identification of a coloring status in accordance with some embodiments.
Figure 3B:
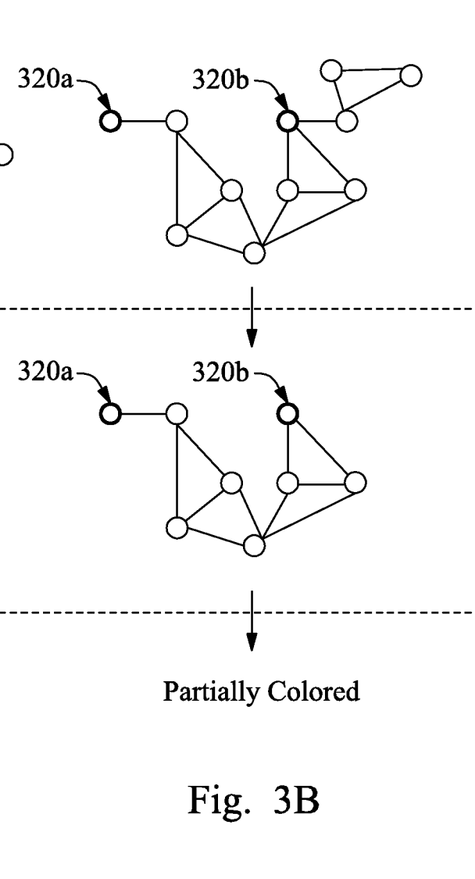
Figure 3C:
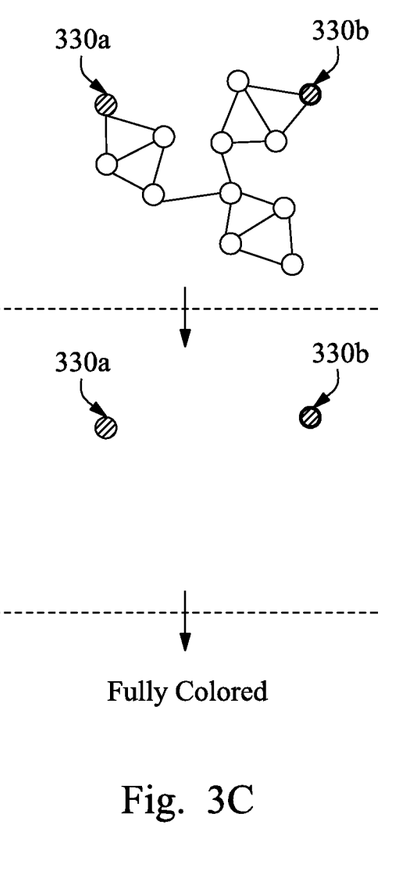

FIGS. 3A-3C are views of transitions of conflict diagrams through identification of a coloring status in accordance with some embodiments. FIGS. 2A-2C are examples of TP. Therefore, anchor nodes are set to a degree of 3 and nodes having a degree of 2 or less are excluded.

FIG. 3A is a view of a conflict diagram having one anchor node 310. In operation 106, anchor node 310 is excluded because the anchor node is the only anchor node. Additional nodes are excluded using operation 106, until only nodes having a degree of 3 or higher remain. The conflict diagram following operation 106 is free of nodes having a pre-defined color. In operation 108, the conflict diagram free of nodes having a pre-defined color is determined to have a colorless status because none of the nodes in the conflict diagram have a pre-defined color.

FIG. 3B is a view of a conflict diagram having an anchor node 320a and an anchor node 320b. The conflict diagram of FIG. 3B before and after operation 106 is similar to the conflict diagram of FIG. 2B. The conflict diagram following operation 106 includes both nodes having a pre-defined color, anchor nodes 320a and 320b, as well as nodes which are free of color. In operation 108, the conflict diagram following operation 106 is determined to have a partially colored status because anchor nodes 320a and 320b have color while other nodes within the conflict diagram are free of color.

FIG. 3C is a view of a conflict diagram having an anchor node 330a and an anchor node 330b. The conflict diagram of FIG. 3C before and after operation 106 is similar to the conflict diagram of FIG. 2C. The conflict diagram following operation 106 includes only nodes which have a pre-defined color, anchor nodes 330a and 330b. In operation 108, the conflict diagram following operation 106 is determined to have a fully colored status because only nodes which have a pre-defined color, anchor nodes 330a and 330b, remain.

Returning to FIG. 1, the operation which follows operation 108 is determined based on the determined coloring status. Method 100 continues with operation 110 if the coloring status is determined to be colorless. In operation 110, an nP check is used to determine whether the colorless conflict diagram after operation 106 is colorable. The n in nP is the same as in operation 106. For example, a TP check is performed when n is equal to 3 in operation 106. In some embodiments, the nP check is performed using commercially available tools or software. In some embodiments, the nP check is performed using commercially available tools from Mentor Graphics, Cadence, Synopsys. In some embodiments, the nP check is performed using a rule-based process. In some embodiments, the rule-based process determines colorability of the conflict diagram after operation 106 based on a number of links or a number of loops within the conflict diagram. In some embodiments, the nP check is performed using a heuristic process. In some embodiments, the nP check proposes a coloring solution for the conflict diagram. If the nP check determines that the conflict diagram is colorable, then method 100 continues with operation 120 in which the circuit information is determined to be colorable. If the nP check determines that the conflict diagram is not colorable, or fails to generate a potential coloring solution, method 100 continues with operation 112 in which a violation is reported. In some embodiments, the nP check is performed by a same computer used to perform as at least one of operation 104, operation 106 or operation 108. In some embodiments, the nP check is performed by a different computer from that used to perform at least one of operation 104, operation 106 or operation 108.

Method 100 proceeds from operation 108 to operation 112 if the conflict diagram after operation 106 is determined to have a partially colored status. In operation 112, a violation is reported. The violation alerts a circuit designer or a customer that no potential coloring solution was found for the received circuit information. In some embodiments, the violation report includes the conflict diagram after operation 106. In some embodiments, the violation report includes an identification of the features in the circuit information which caused the violation. In some embodiments, the violation report includes recommended or potential modifications to the circuit information to resolve the violation. In some embodiments, the violation recommends increasing a number of masks for manufacturing a circuit based on the circuit information. For example, if a degree of 3 failed to produce a potential coloring solution, the violation report includes a recommendation to increase the degree to 4 or increase a separation distance, in some embodiments. In some embodiments, the violation report is generated by a same computer used to perform as at least one of operation 104, operation 106, operation 108 or operation 110. In some embodiments, the violation report is generated by a different computer from that used to perform at least one of operation 104, operation 106, operation 108 or operation 110.

Method 100 proceeds from operation 108 to operation 114 if the conflict diagram after operation 106 is determined to have a fully colored status. In operation 114, link rules are checked. Link rules require that a link cannot connect two nodes having a same color. The link rules check helps to detect errors introduced by the pre-defined coloring of anchor nodes. In operation 114, the conflict diagram is analyzed to ensure that each link connects nodes having different colors. If the link rules check determines that all link rules are satisfied, method 100 continues with operation 120 in which the circuit information is determined to be colorable. If the link rules check determines that at least one link rule is not satisfied, method 100 continues with operation 112, in which a violation is reported. In some embodiments, the link rules check is performed by a same computer used to perform at least one of operation 104, operation 106, operation 108, operation 110 or operation 112. In some embodiments, the link rules check is performed by a different computer from that used to perform at least one of operation 104, operation 106, operation 108, operation 110 or operation 112.

In operation 120, the received circuit information is determined to be nP colorable. A colorability report is conveyed to a circuit designer or a customer that at least one potential coloring solution was found for the received circuit information. In some embodiments, the color report includes the conflict diagram after operation 106. In some embodiments, the colorability report includes at least one potential coloring solution for the received circuit information. In some embodiments, the colorability report determines whether a decrease in a degree is possible. For example, if a degree of 4 produced a potential coloring solution, the colorability report includes a recommendation to decrease the degree to 3, in some embodiments. In some embodiments, the colorability report is generated by a same computer used to perform at least one of operation 104, operation 106, operation 108, operation 110, operation 112 or operation 114. In some embodiments, the colorability report is generated by a different computer from that used to perform at least one of operation 104, operation 106, operation 108, operation 110, operation 112 or operation 114.

In some embodiments, method 100 includes use of APR information. The APR information is received in operation 130. The APR information is used to help generate the conflict diagram for the received circuit information. The APR information includes information related to previous coloring solutions for a cell which is included in the received circuit information in the form of an APR block. For example, if the received circuit information includes an inverter having features which match another inverter for which a potential coloring solution was previously developed, an APR block which includes the previously developed coloring solution is inserted into the conflict diagram generated in operation 104. The use of APR block helps to reduce an amount of time used to determine colorability of the received circuit information by reducing a number of nodes analyzed during method 100. In some embodiments, the APR information is stored on a same computer used to perform as at least one of operation 104, operation 106, operation 108, operation 110, operation 112, operation 114 or operation 120. In some embodiments, the APR information is stored on a different computer from that used to perform as at least one of operation 104, operation 106, operation 108, operation 110, operation 112, operation 114 or operation 120.

Figure 4A:
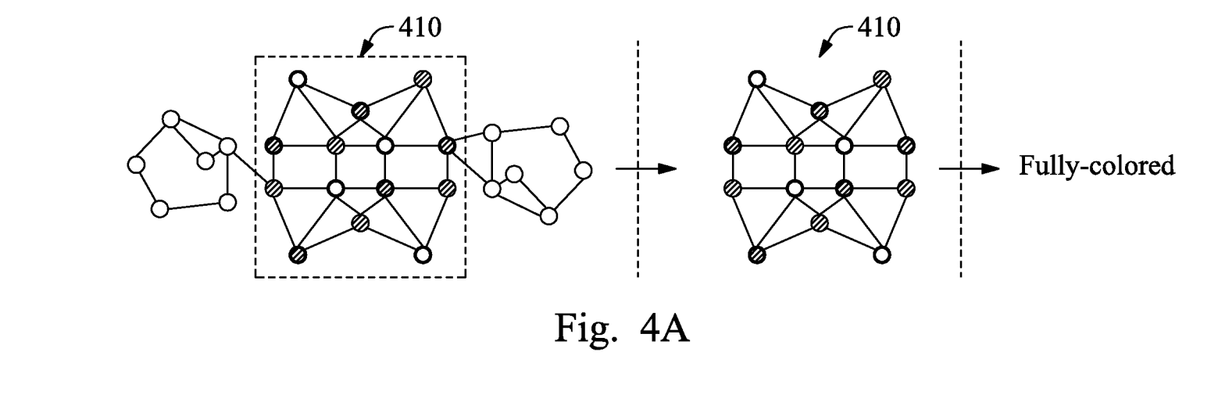
FIGS. 4A-4B are views of conflict diagrams including an automatic placement and routing (APR) block in accordance with some embodiments.
Figure 4B:
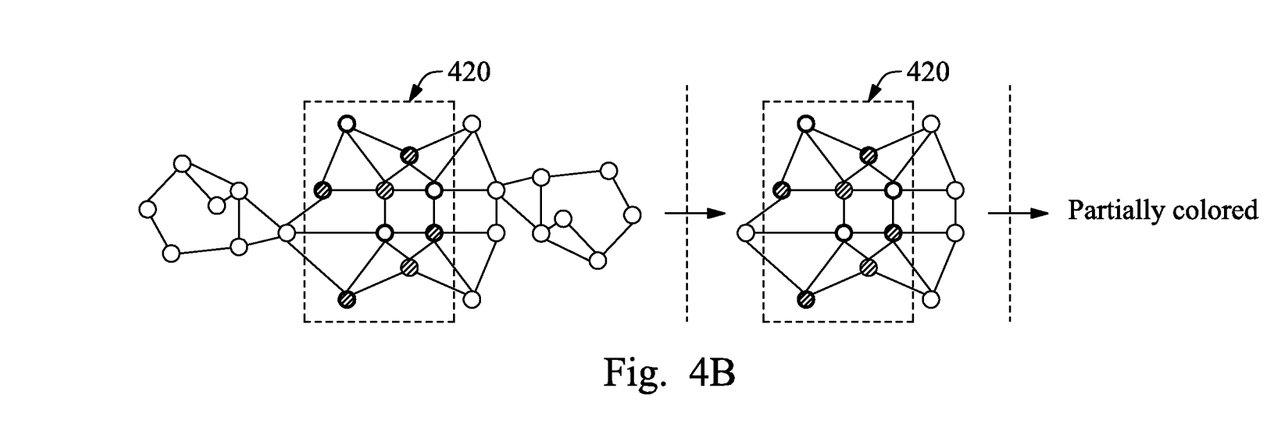

FIGS. 4A-4B are views of conflict diagrams including an APR block in accordance with some embodiments. FIG. 4A is a view of a conflict diagram including an APR block 410. The conflict diagram undergoes the exclusion process of operation 106. In the example of FIG. 4A, the degree is set to 3, i.e., a TP process. The result is that only APR block 410 remains following the exclusion operation. The coloring status check then determines that the conflict diagram is fully colored in operation 108. Without the use of the APR information, operation 108 would return a status of colorless, if no anchor point was included. Method 100 would then perform nP check to determine if a potential coloring solution exists. Instead, using the APR information, method 100 performs a links rule check which is less time consuming than the nP check.

FIG. 4B is a view of a conflict diagram including an APR block 420. The conflict diagram undergoes the exclusion process of operation 106. In the example of FIG. 4B, the degree is set to 3, i.e., a TP process. The result is that APR block 420 as well as other nodes having no pre-defined color remains following the exclusion operation. The coloring status check then determines that the conflict diagram is partially colored in operation 108. Without the use of the APR information, operation 108 would return a status of colorless, if no anchor point was included. Method 100 would then be performed to perform nP check to determine if a potential coloring solution exists. Instead, using the APR information, method 100 proceeds directly to reporting the violation which is less time consuming than the nP check.

In comparison with other approaches, method 100 helps to avoid elimination of potential coloring solutions from a solution space for the received circuit information, and reduces processing time. By using the exclusion operation 106 to reduce the number of nodes to be analyzed for colorability, the processing time is reduced in comparison with other approaches which seek to find a potential coloring solution for an entire conflict diagram. Focusing on only the portion of the conflict diagram which remains following the exclusion operation 106 also helps to avoid elimination of potential coloring solutions by not assigning a color to a node merely because the color satisfies the defined rules. By not assigning a color to a node based solely on the defined rules, permits a circuit designer or customer to select a color for a node which helps to reduce production costs, increases yield, or enhances manufacturability, in some embodiments.

Figure 5:
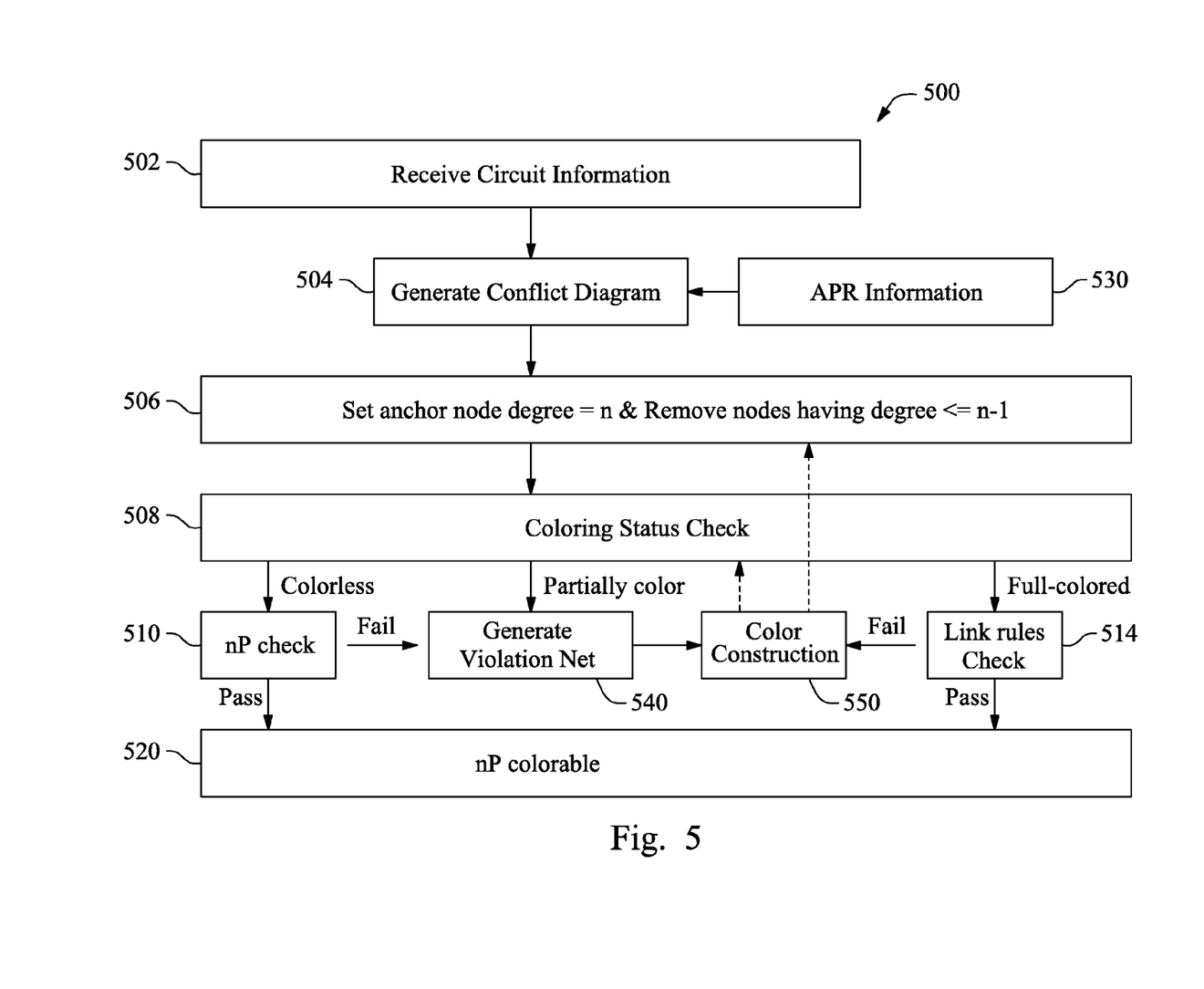
FIG. 5 is a flowchart of a method of determining colorability of a layout in accordance with some embodiments.

FIG. 5 is a flowchart of a method 500 of determining colorability of a layout in accordance with some embodiments. Method 500 is similar to method 100 and similar operations have a same reference number increased by 400. In comparison with method 100, method 500 includes operations 540 and 550. If the coloring status check in operation 508 determines that the conflict diagram is partially colored, method 500 proceeds to operation 540 in which a violation net is generated. Similarly, if the nP check in operation 510 fails to identify a potential coloring solution, method 500 continues to operation 540. A violation net is conflict diagram following the exclusions of operation 506, including the coloring information of the APR information or anchor nodes. In some embodiments, the violation net identifies at least one node or at least one link preventing further exclusions.

In operation 550, a color construction is performed. The color construction is performed following generation of the violation net or if the link rules check in operation 514 fails. A color construction includes review of the violation net or the failed link rules to determine whether a different coloring solution is possible. If no different coloring solution is possible, the circuit information is modified, in some embodiments. In some embodiments, the modifications to the circuit information includes adjusting pre-defined coloring, adjusting separation distances between features in the circuit information, assignment of colors to at least one node regardless of link rules, or other suitable adjustments to the conflict diagram or circuit information. In some embodiments, method 500 returns to operation 506 following the color construction. In some embodiments, method 500 returns to operation 508 following the color construction. In some embodiments, the color construction is performed on a same computer used to perform as at least one of operation 504, operation 506, operation 508, operation 510, operation 512, operation 514, operation 520 or operation 530. In some embodiments, the color construction is performed on a different computer from that used to perform as at least one of operation 504, operation 506, operation 508, operation 510, operation 512, operation 514, operation 520 or operation 530.

Figure 6A:
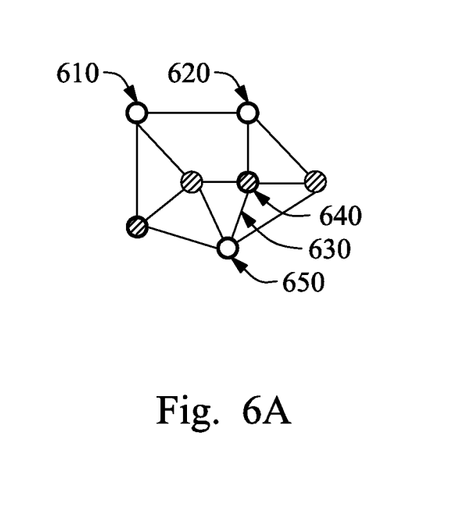
FIGS. 6A-6B are views of conflict diagrams before and after a color construction in accordance with some embodiments.
Figure 6B:
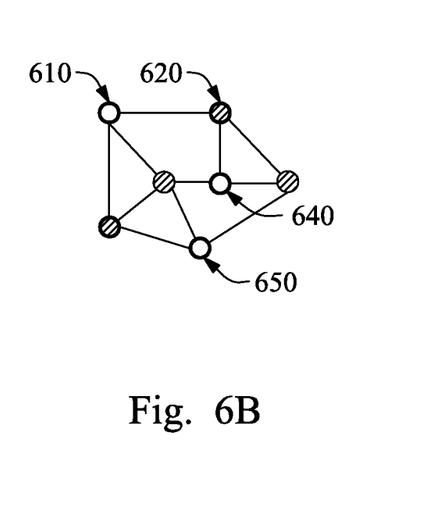

FIGS. 6A-6B are views of conflict diagrams before and after a color construction in accordance with some embodiments. FIG. 6A is a view of a conflict diagram including a node 610 linked to a node 620, both nodes 610 and 620 have a same color. The conflict diagram of FIG. 6A also includes a link 630 between node 640 and node 650. The conflict diagram of FIG. 6A would be considered fully colored during the coloring status of operation 508. However, the links rules check of operation 514 would identify a failed link due to nodes 610 and 620 having the same color. Therefore, method 500 proceeds to operation 550 in which a color construction is performed.

FIG. 6B is a view of a conflict diagram following color construction of operation 550. In comparison with FIG. 6A, the conflict diagram of FIG. 6B removes link 630 between node 640 and node 650. In some embodiments, link 630 is removed by increasing a separation distance between node 640 and node 650. In some embodiments, link 630 is removed by relaxing spacing rules for the circuit information, e.g., reducing a minimum spacing distance. Due to the modification of the conflict diagram during the color construction, a fully colored conflict diagram which satisfies the link rules is achieved.

Figure 7:
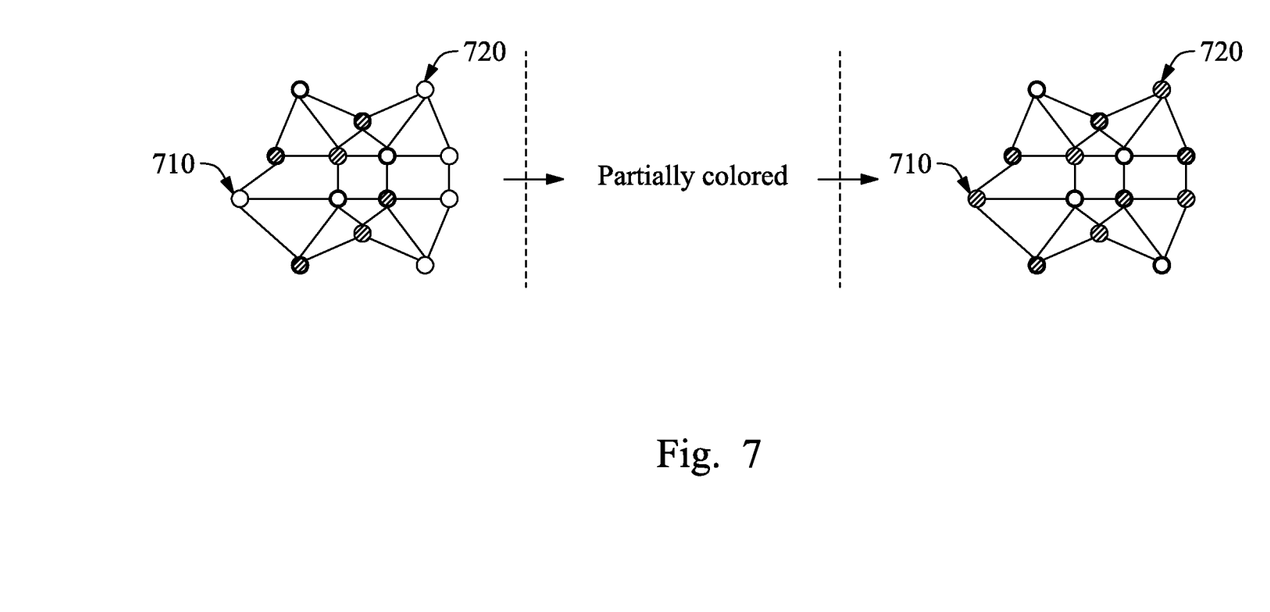
FIG. 7 is a view of conflict diagram before and after a color construction in accordance with some embodiments.

FIG. 7 is a view of a conflict diagram before and after a color construction in accordance with some embodiments. FIG. 7 includes a conflict diagram following the exclusion process of operation 506. The conflict diagram includes a several colored nodes as well as several nodes which are not colored, including a node 710 and a node 720. FIG. 7 is based on an example of a degree 3 process. Each of the remaining nodes in the conflict diagram includes at least 3 links. Based on the output of the exclusion operation 506, the color status check will output a status of partially colored. The partially colored conflict diagram is then used to develop a violation net in operation 540. Based on the violation net, a color construction is performed to produce a fully colored conflict diagram in operation 550. In the example of FIG. 7, the previously uncolored nodes are assigned colors. In this example node 710 and node 720 are assigned a same color. These color assignments result in nodes sharing a link having different colors. As a result, if the conflict diagram is supplied to color status check 508, a fully colored status would result.

Figure 8:
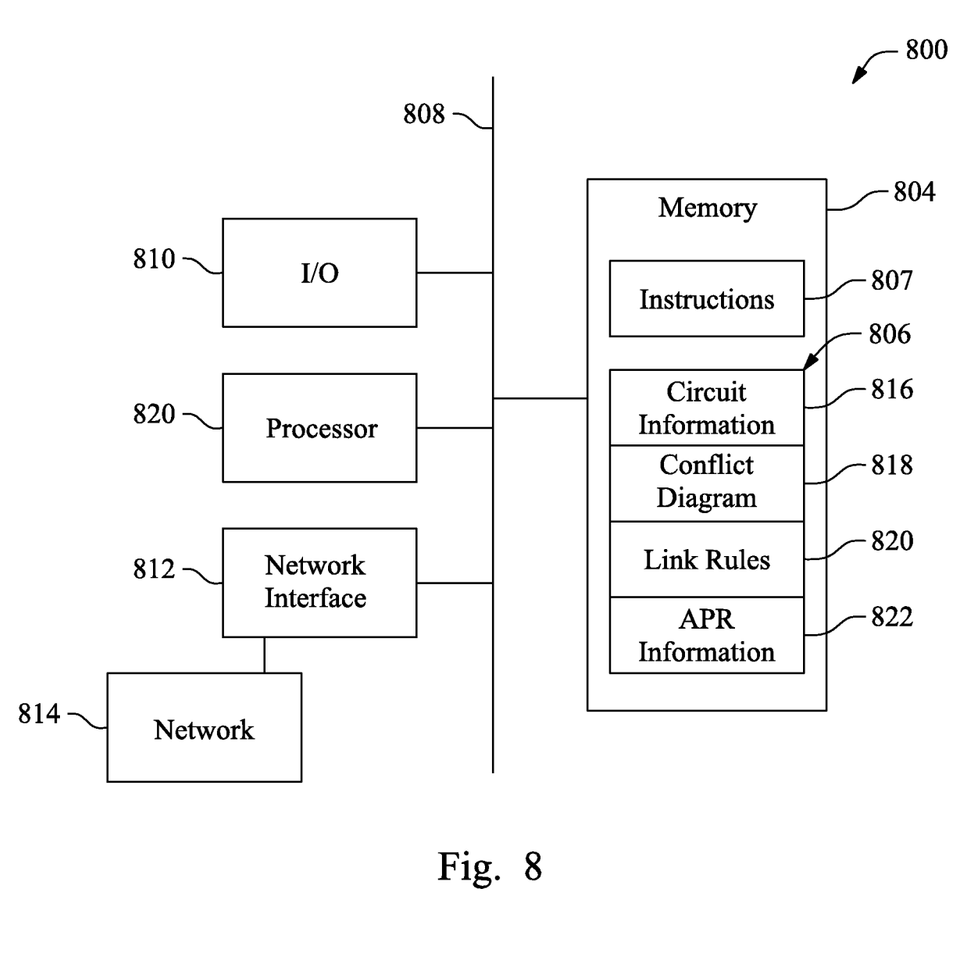
FIG. 8 is a block diagram of a specific-purpose computer for determining colorability of a layout in accordance with some embodiments.

FIG. 8 is a block diagram of a specific-purpose computer system 800 for determining colorability of a layout in accordance with some embodiments. System 800 includes a hardware processor 802 and a non-transitory, computer readable storage medium 804 encoded with, i.e., storing, the computer program code 806, i.e., a set of executable instructions. Computer readable storage medium 804 is also encoded with instructions 807 for interfacing with manufacturing machines for producing the memory array. The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814. The processor 802 is configured to execute the computer program code 806 encoded in the computer readable storage medium 804 in order to cause system 800 to be usable for performing a portion or all of the operations as described in method 100 or method 500.

In some embodiments, the processor 802 is a central processing unit (CPU), a multi-processor, a distributed processing system, an application specific integrated circuit (ASIC), and/or a suitable processing unit.

In some embodiments, the computer readable storage medium 804 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 804 includes a compact disk-read only memory (CD-ROM), a compact disk-read/write (CD-R/W), and/or a digital video disc (DVD).

In some embodiments, the storage medium 804 stores the computer program code 806 configured to cause system 800 to perform method 100 or method 500. In some embodiments, the storage medium 804 also stores information needed for performing a method 100 or 500 as well as information generated during performing the method 100 or 500, such as a circuit information parameter 816, a conflict diagram parameter 818, a link rules parameter 820, an APR information parameter 822, and/or a set of executable instructions to perform the operation of method 100 or 500.

In some embodiments, the storage medium 804 stores instructions 807 for interfacing with manufacturing machines. The instructions 807 enable processor 802 to generate manufacturing instructions readable by the manufacturing machines to effectively implement method 100 or 500 during a manufacturing process.

System 800 includes I/O interface 810. I/O interface 810 is coupled to external circuitry. In some embodiments, I/O interface 810 includes a keyboard, keypad, mouse, trackball, trackpad, and/or cursor direction keys for communicating information and commands to processor 502.

System 800 also includes network interface 812 coupled to the processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interface such as ETHERNET, USB, or IEEE-1394. In some embodiments, method 100 or 500 is implemented in two or more systems 800, and information such as memory type, memory array layout, I/O voltage, I/O pin location and charge pump are exchanged between different systems 800 via network 814.

System 800 is configured to receive circuit information through I/O interface 810 or network interface 812. The information is transferred to processor 802 via bus 808 to generate a conflict diagram. The circuit information is then stored in computer readable medium 804 as circuit information parameter 816. System 800 is configured to generate the conflict diagram based on the circuit information. The information is stored in computer readable medium 804 as conflict diagram parameter 818. System 800 is configured to receive information related to link rules through I/O interface 810 or network interface 812. The information is stored in computer readable medium 804 as link rules parameter 820. System 800 is configured to receive information related to APR information through I/O interface 810 or network interface 812. The information is stored in computer readable medium 804 as APR information parameter 822.

During operation, processor 802 executes a set of instructions to generate a conflict diagram based on circuit information parameter 816. Processor 502 also combines APR information with the conflict diagram based on APR information parameter 822, circuit information parameter 816 and conflict diagram parameter 818. Processor 502 is also configured to determine compliance with link rules based on link rules parameter 820 and conflict diagram parameter 818. In some embodiments, processor 502 also executes instructions for performing nP check based on conflict diagram parameter 818. In some embodiments, processor 502 executes instructions for performing the color status check based on conflict diagram parameter 818. In some embodiments, processor 502 executes instructions for generating a violation net based on conflict diagram parameter 818. In some embodiments, processor 502 executes instructions for performing the color construction based on conflict diagram parameter 818.

One aspect of this description relates to a method of determining colorability of a layout. The method includes generating a conflict diagram based on circuit information. The conflict diagram includes a plurality of nodes, each node of the plurality of nodes is connected to at least another node of the plurality of nodes by a link, and each node of the plurality of nodes has a degree equal to a number of links connected to the node. The method further includes setting a degree of each anchor node within the conflict diagram to a value of n, where n is equal to a number of mask usable to manufacture the layout. The method further includes excluding, using a processor, nodes having a degree less than n from the conflict diagram. The method further includes performing a color status check on the conflict diagram after the excluding; and determining whether the layout is colorable based on the performed color status check.

Another aspect of this description relates to a method of determining colorability of a layout. The method includes generating a conflict diagram based on circuit information. The conflict diagram includes a plurality of nodes, each node of the plurality of nodes is connected to at least another node of the plurality of nodes by a link, and each node of the plurality of nodes has a degree equal to a number of links connected to the node. The method further includes setting a degree of each anchor node within the conflict diagram to a value of n, where n is equal to a number of mask usable to manufacture the layout. The method further includes excluding, using a processor, nodes having a degree less than n from the conflict diagram. The method further includes identifying a status of the conflict diagram after the excluding, wherein the status is selected from the group consisting of colorless, partially colored and fully colored. The method further includes determining whether the layout is colorable based on the status of the conflict diagram after the excluding.

Still another aspect of this description relates to a system for determining colorability of a layout. The system includes a processor and a non-transitory computer readable medium connected to the processor. The non-transitory computer readable medium is configured to store instructions for generating a conflict diagram based on circuit information. The conflict diagram includes a plurality of nodes, each node of the plurality of nodes is connected to at least another node of the plurality of nodes by a link, and each node of the plurality of nodes has a degree equal to a number of links connected to the node. The non-transitory computer readable medium is further configured to store instructions for setting a degree of each anchor node within the conflict diagram to a value of n, where n is equal to a number of masks usable to manufacture the layout. The non-transitory computer readable medium is further configured to store instructions for excluding nodes having a degree less than n from the conflict diagram. The non-transitory computer readable medium is further configured to store instructions for performing a color status check on the conflict diagram after the excluding; and determining whether the layout is colorable based on the performed color status check.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of determining colorability of a layout, the method comprising:
    generating a conflict diagram based on circuit information, wherein the conflict diagram includes a plurality of nodes, each node of the plurality of nodes is connected to at least another node of the plurality of nodes by a link, each node of the plurality of nodes has a degree equal to a number of links connected to the node, and the plurality of nodes includes at least one anchor node having a pre-defined color;
    setting a degree of each anchor node of the plurality of nodes within the conflict diagram to a value of n, where n is equal to a number of masks usable to manufacture the layout;
    excluding, using a processor, nodes having a degree less than n from the conflict diagram;
    performing a color status check on the conflict diagram after the excluding; and
    determining whether the layout is colorable based on the performed color status check.

2. The method of claim 1, wherein generating the conflict diagram comprises including automatic placement and routing (APR) information.

3. The method of claim 1, wherein performing the color status check comprises identifying the conflict diagram after the excluding as one selected from the group consisting of colorless, partially colored, and fully colored.

4. The method of claim 3, further comprising performing an n-patterning (nP) check of the conflict diagram after the excluding is identified as colorless.

5. The method of claim 4, further comprising reporting a violation if the conflict diagram after the excluding fails the nP check.

6. The method of claim 4, further comprising confirming the layout is colorable if the conflict diagram passes the nP check.

7. The method of claim 4, further comprising generating a violation net if the conflict diagram after the excluding fails the nP check.

8. The method of claim 7, further comprising performing a color construction based on the violation net.

9. The method of claim 3, further comprising reporting a violation if the conflict diagram after the excluding is identified as partially colored.

10. The method of claim 3, further comprising generating a violation net if the conflict diagram after the excluding is identified as partially colored.

11. The method of claim 10, further comprising performing a color construction based on the violation net.

12. The method of claim 3, further comprising performing a link rules check if the conflict diagram after the excluding is identified as fully colored.

13. The method of claim 12, further comprising reporting a violation if the conflict diagram after the excluding fails the link rules check.

14. The method of claim 12, further comprising performing a color construction if the conflict diagram after the excluding fails the link rules check.

15. The method of claim 12, further comprising confirming the layout is colorable if the conflict diagram passes the link rules check.

16. A method of determining colorability of a layout, the method comprising:
    generating a conflict diagram based on circuit information, wherein the conflict diagram includes a plurality of nodes, each node of the plurality of nodes is connected to at least another node of the plurality of nodes by a link, each node of the plurality of nodes has a degree equal to a number of links connected to the node, and the plurality of nodes includes at least one anchor node having a pre-defined color;
    setting a degree of each anchor node of the plurality of nodes within the conflict diagram to a value of n, where n is equal to a number of masks usable to manufacture the layout;
    excluding, using a processor, nodes having a degree less than n from the conflict diagram;
    identifying a status of the conflict diagram after the excluding, wherein the status is selected from the group consisting of colorless, partially colored and fully colored; and
    determining whether the layout is colorable based on the status of the conflict diagram after the excluding.

17. The method of claim 16, wherein setting the degree of each anchor node comprises setting the degree of each anchor node to a value of n.

18. The method of claim 16, wherein generating the conflict diagram comprises generating the conflict diagram based on automatic placement and routing (APR) information.

19. The method of claim 18, wherein generating the conflict diagram based on the APR information comprises incorporated coloring information from a prior layout into the conflict diagram.

20. A system for determining colorability of a layout, the system comprising:
    a processor; and
    a non-transitory computer readable medium connected to the processor, wherein the non-transitory computer readable medium is configured to store instructions for:
        generating a conflict diagram based on circuit information, wherein the conflict diagram includes a plurality of nodes, each node of the plurality of nodes is connected to at least another node of the plurality of nodes by a link, each node of the plurality of nodes has a degree equal to a number of links connected to the node, and the plurality of nodes includes at least one anchor node having a pre-defined color;
        setting a degree of each anchor node of the plurality of nodes within the conflict diagram to a value of n, where n is equal to a number of masks usable to manufacture the layout;
        excluding nodes having a degree less than n from the conflict diagram;
        performing a color status check on the conflict diagram after the excluding; and
        determining whether the layout is colorable based on the performed color status check.

* * * * *